United States Patent
Havskjold et al.

(10) Patent No.: US 9,407,798 B2
(45) Date of Patent: Aug. 2, 2016

(54) ELECTRONIC DEVICE HAVING A FLEXIBLE PRINTED CIRCUIT BIASING STRUCTURE

(71) Applicant: Apple Inc., Cupertino, CA (US)

(72) Inventors: David G. Havskjold, Portola Valley, CA (US); Emery A. Sanford, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 194 days.

(21) Appl. No.: 14/028,268

(22) Filed: Sep. 16, 2013

(65) Prior Publication Data
US 2015/0077624 A1 Mar. 19, 2015

(51) Int. Cl.
| | |
|---|---|
| H04N 5/225 | (2006.01) |
| H04M 1/02 | (2006.01) |
| H05K 1/02 | (2006.01) |
| G01J 1/42 | (2006.01) |
| H05K 1/18 | (2006.01) |

(52) U.S. Cl.
CPC ............ *H04N 5/2253* (2013.01); *G01J 1/4204* (2013.01); *H04M 1/0277* (2013.01); *H05K 1/028* (2013.01); *H04M 1/0264* (2013.01); *H04M 2250/12* (2013.01); *H05K 1/189* (2013.01); *H05K 2201/046* (2013.01); *H05K 2201/055* (2013.01); *H05K 2201/057* (2013.01); *H05K 2201/09045* (2013.01)

(58) Field of Classification Search
CPC ............ H04M 1/0264; H04M 1/0277; H04M 2250/12; H04N 1/00307; H04N 5/2252; H05K 1/028; H05K 2201/046; H05K 1/189; H05K 2201/055; H05K 2201/057; H05K 2201/09045; G01J 1/4204
USPC .................................................. 348/373, 374
See application file for complete search history.

(56) References Cited

U.S. PATENT DOCUMENTS

| | | | |
|---|---|---|---|
| 6,755,683 B2 | 6/2004 | Roberts et al. | |
| 8,041,201 B2 | 10/2011 | Eromaki et al. | |
| 2007/0109208 A1* | 5/2007 | Turner | 343/718 |
| 2012/0050114 A1 | 3/2012 | Li et al. | |
| 2013/0106684 A1 | 5/2013 | Weast et al. | |
| 2013/0242600 A1 | 9/2013 | Franklin et al. | |

FOREIGN PATENT DOCUMENTS

| | | | |
|---|---|---|---|
| JP | 2008172632 A | * | 7/2008 |
| WO | WO 2013134017 A1 | * | 9/2013 |

* cited by examiner

*Primary Examiner* — Nelson D. Hernández Hernández
(74) *Attorney, Agent, or Firm* — Treyz Law Group, P.C.; G. Victor Treyz; Zachary D. Hadd

(57) ABSTRACT

An electronic device may have electrical components such as input-output devices. An electrical component may be mounted on a flexible printed circuit. The flexible printed circuit may have a bend that forms a flexible printed circuit spring to bias the electrical component in a desired direction. The electronic device may have a display with a display cover layer. In an inactive display area, opaque masking material may be formed on the display cover layer. A light window may be formed in the opaque masking layer. The flexible printed circuit spring may bias the electrical component against the display cover layer in alignment with the light window. An air gap under the electrical component may separate the component from a planar portion of the flexible printed circuit that is overlapped by the electrical component. The electrical component may be a camera, a light sensor, or other device.

18 Claims, 21 Drawing Sheets

ELECTRONIC DEVICE HAVING A FLEXIBLE PRINTED CIRCUIT BIASING STRUCTURE

BACKGROUND

This relates generally to electronic devices, and, more particularly, to biasing structures for electronic devices.

Electronic devices include components such as cameras and other electrical components. Cameras may be mounted against camera windows in inactive portions of displays. A foam pad is typically used to ensure that a camera is seated properly against the surface of a camera window in a display. The foam pad is formed from a resilient polymer material that tends to expand when compressed. When the foam is compressed with the camera, the foam tends to rebound and thereby press the camera against the surface of the camera window.

Use of a foam pad to bias a sensitive component such as the camera towards a camera window can give rise to assembly challenges. If care is not taken, the camera may be damaged during assembly. For example, over-compression of the foam can cause an image sensor chip in the camera to crack, rendering the camera inoperable.

It would therefore be desirable to be able to provide improved biasing structures for components in electronic devices such as cameras.

SUMMARY

An electronic device may have electrical components such as input-output devices. A display may be mounted within the housing. The display may have a display cover layer. In an inactive portion of the display, the underside of the display cover layer may be coated with an opaque masking layer having a light opening.

An electrical component in the electronic device may be mounted on a flexible printed circuit. The flexible printed circuit may have a bend. Due to the presence of the bend, the flexible printed circuit serves as a biasing structure that imparts a biasing force to the electrical component. The flexible printed circuit biasing structure formed from the bent flexible printed circuit may bias the electrical component against the display cover layer in alignment with the light opening or may bias the electrical component against other electronic device structures.

The electrical component may overlap a portion of the flexible printed circuit other than the portion of the flexible printed circuit to which the electrical component is directly mounted. The electronic device housing may have an inner surface. The portion of the flexible printed circuit that is overlapped by the electrical component may rest on the inner surface and may be separated from the electrical component by an air gap. The presence of the air gap may help avoid damage to the electrical component that might otherwise arise when biasing an electrical component using a foam pad.

The electrical component may be a light sensor such as a light-based proximity sensor or an ambient light sensor or may be a camera or other electrical component. The flexible printed circuit may have a shape that forms a service loop to facilitate assembly of the electronic device.

DETAILED DESCRIPTION

Electronic devices may be provided with electrical components that are mounted on substrates such as printed circuits. For example, an electrical component may be mounted on a flexible printed circuit using solder or conductive adhesive. Flexible printed circuits contain conductive signal lines formed from metal traces on flexible polymer substrates such as sheets of polyimide or other flexible polymer layers. To help ensure that components are pressed into desired mounting locations, an electronic device may be provided with a biasing structure that is formed from a flexible printed circuit. For example, a flexible printed circuit may be bent to form a flexible printed circuit spring. Traces in the flexible printed circuit may be used to carry signals associated with one or more electrical components that are mounted on the flexible printed circuit. The flexible printed circuit spring may help hold the electrical component in a desired location within the electronic device.

Figure 1:
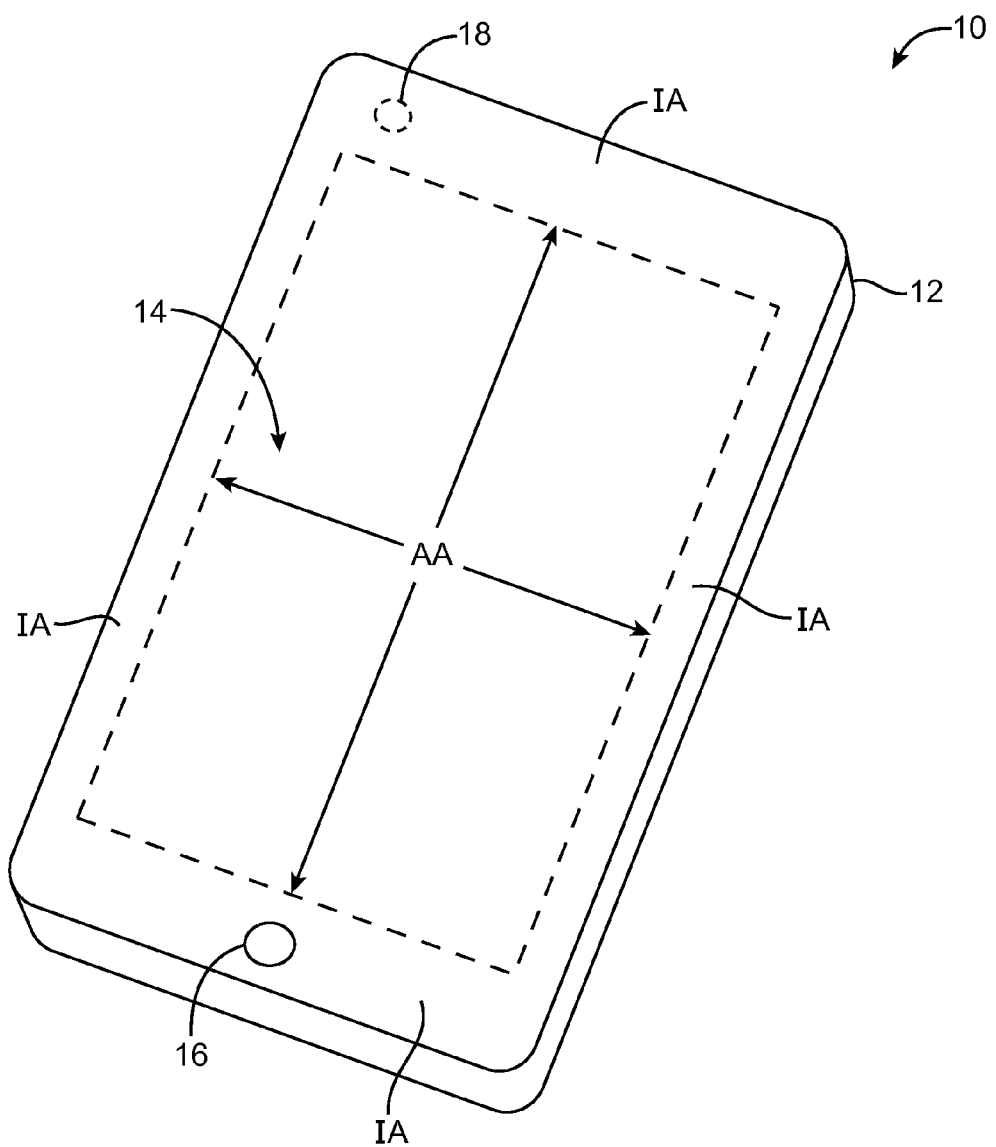
FIG. 1 is a perspective view of an illustrative electronic device such as a handheld computing device of the type that may be provided with a biasing structure in accordance with an embodiment.

An illustrative electronic device of the type that may be provided with a flexible printed circuit biasing structure is shown in FIG. 1. An electronic device such as electronic device 10 of FIG. 1 may be a computing device such as a laptop computer, a computer monitor containing an embedded computer, a tablet computer, a cellular telephone, a media player, or other handheld or portable electronic device, a smaller device such as a wrist-watch device, a pendant device, a headphone or earpiece device, or other wearable or miniature device, a television, a computer display that does not contain an embedded computer, a gaming device, a navigation device, an embedded system such as a system in which electronic equipment with a display is mounted in a kiosk or automobile, equipment that implements the functionality of two or more of these devices, or other electronic equipment. In the illustrative configuration of FIG. 1, device 10 is a portable device such as a cellular telephone, media player, tablet computer, or other portable computing device. Other configurations may be used for device 10 if desired. The example of FIG. 1 is merely illustrative.

Device 10 may have one or more displays such as display 14 mounted in housing structures such as housing 12. Housing 12 of device 10, which is sometimes referred to as a case, may be formed of materials such as plastic, glass, ceramics, carbon-fiber composites and other fiber-based composites, metal (e.g., machined aluminum, stainless steel, or other metals), other materials, or a combination of these materials. Device 10 may be formed using a unibody construction in which most or all of housing 12 is formed from a single structural element (e.g., a piece of machined metal or a piece of molded plastic) or may be formed from multiple housing structures (e.g., outer housing structures that have been mounted to internal frame elements or other internal housing structures).

Display 14 may be a touch sensitive display that includes a touch sensor or may be insensitive to touch. Touch sensors for display 14 may be formed from an array of capacitive touch sensor electrodes, a resistive touch array, touch sensor structures based on acoustic touch, optical touch, or force-based touch technologies, or other suitable touch sensor components.

Display 14 for device 10 includes display pixels formed from liquid crystal display (LCD) components or other suitable display pixel structures such as organic light-emitting diode display pixels, electrophoretic display pixels, plasma display pixels, etc. The display pixels may be arranged in an array having numerous rows and columns to form rectangular active area AA of FIG. 1. Rectangular active area AA may be located in the center of device 10 and may be surrounded by inactive border regions such as inactive area IA. Inactive area IA may have a rectangular ring shape of the type shown in FIG. 1 or may extend only along a pair of the edges of device 10 (e.g., along the upper and lower edges of device 10 in a configuration in which the left and right edges of device 10 are borderless). Other inactive area shapes may be used, if desired.

A display cover layer may cover the surface of display 14 or a display layer such as a color filter layer (e.g., a layer formed from a clear substrate covered with patterned color filter elements) or other portion of a display may be used as the outermost (or nearly outermost) layer in display 14. The outermost display layer may be formed from a transparent glass sheet, a clear plastic layer, or other transparent member. To hide internal components from view, the underside of the outermost display layer or other display layer surface in inactive area IA may be coated with an opaque masking layer such as a layer of ink (e.g., black ink). If desired, openings may be formed in the outermost layer of display 14 (e.g., in inactive area IA) to accommodate components such as button 16. If desired, an opening for a speaker port or other openings may be formed in the outermost layer of display 14. Buttons, connector ports, audio ports, and other structures may also be accommodated using openings in housing 12.

One or more optical components (e.g., electrical components that detect light) may be incorporated into device 10. Optical components that may be incorporated into device 10 include cameras (sometimes referred to as digital image sensors), light-based proximity sensors (e.g., sensors that detect reflected infrared light), and ambient light sensors. A camera or a light sensor may be mounted behind openings in the sidewalls or rear wall of housing 12. As shown in FIG. 1, display 14 may have a region within inactive area IA such as area 18 under which one or more light sensors may be mounted. The opaque masking layer in area 18 may, if desired, be provided with a window (e.g., a light window such as a camera window opening or sensor window opening in the opaque masking layer). The light window may allow light to pass through display 14 to reach a light-sensitive component such as a camera, proximity sensor, or ambient light sensor that is mounted within housing 12 in alignment with the light window. If desired, a window for a camera or light sensor may be formed from a hole in housing 12 or other portions of device 10.

Figure 2:
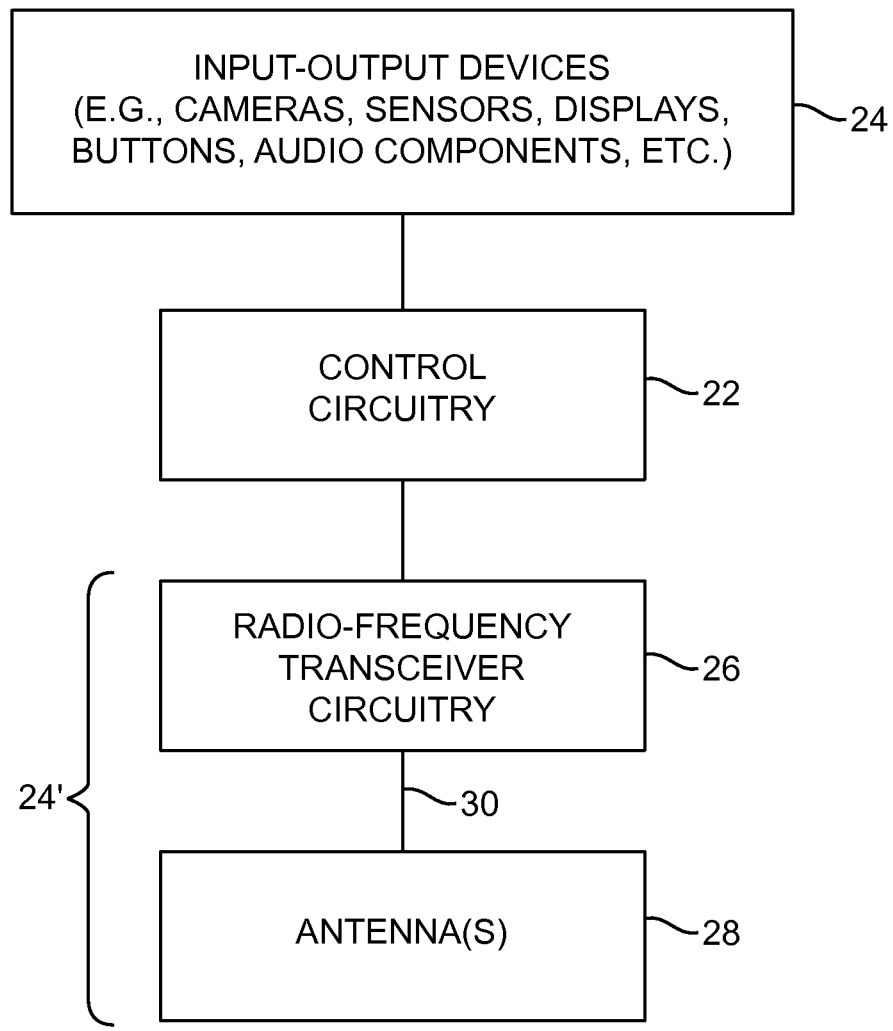
FIG. 2 is a schematic diagram of an illustrative electronic device in accordance with an embodiment.

A schematic diagram of an illustrative configuration that may be used for electronic device 10 is shown in FIG. 2. As shown in FIG. 2, electronic device 10 may include control circuitry 22. Control circuitry 22 may include storage and processing circuitry for controlling the operation of device 10. Control circuitry 22 may, for example, include storage such as hard disk drive storage, nonvolatile memory (e.g., flash memory or other electrically-programmable-read-only memory configured to form a solid state drive), volatile memory (e.g., static or dynamic random-access-memory), etc. Control circuitry 22 may include processing circuitry based on one or more microprocessors, microcontrollers, digital signal processors, baseband processors, power management units, audio codec chips, application specific integrated circuits, etc.

Input-output devices 24 may be used to allow data to be supplied to device 10 and to allow data to be provided from device 10 to external devices. Input-output devices 24 may also include input-output components with which a user can control the operation of device 10. A user may, for example, supply commands through input-output devices 24 and may receive status information and other output from device 10 using the output resources of input-output devices 24.

Input-output devices 24 may include sensors and status indicators such as an ambient light sensor, a proximity sensor, a temperature sensor, a pressure sensor, a magnetic sensor, an accelerometer, and light-emitting diodes and other components for gathering information about the environment in which device 10 is operating and providing information to a user of device 10 about the status of device 10. Audio components in devices 24 may include speakers and tone generators for presenting sound to a user of device 10 and microphones for gathering user audio input. Devices 24 may include one or more displays. Displays may be used to present images for a user such as text, video, and still images. Sensors in devices 24 may include a touch sensor array that is formed as one of the layers in display 14. During operation, user input may be gathered using buttons and other input-output components in devices 24 such as touch pad sensors, buttons, joysticks, click wheels, scrolling wheels, touch sensors such as a touch sensor array in a touch screen display or a touch pad, key pads, keyboards, vibrators, cameras, and other input-output components.

The input-output devices of device 10 may include wireless communications circuitry 24'. Communications circuitry 24' may include radio-frequency transceiver circuitry 26 and one or more antennas 28. Transceiver circuitry 26 may be formed from one or more integrated circuits, power amplifier circuitry, low-noise input amplifiers, passive RF components, or other circuitry. Antenna(s) 28 may include one or more antenna structures such as one or more inverted-F antennas, one or more slot antennas, one or more planar inverted-F antennas, one or more monopole antennas, one or more loop antennas, one or more patch antennas, one or more dipole antennas, or other antennas.

Transceiver circuitry 26 may be coupled to antenna(s) 28 by signal paths such as signal path 30. Signal path 30 may include one or more transmission lines. As an example, signal path 30 of FIG. 2 may be a transmission line having a positive signal conductor and a ground signal conductor that form parts of a coaxial cable or a printed circuit transmission line such as a microstrip transmission line formed from patterned metal traces on a flexible printed circuit.

When installing electrical components in electronic device 10 such as input-output devices 24 and 24' of FIG. 2, it may be desirable to electrically connect the electrical components to circuitry in device 10 (e.g., other input-output devices and/or control circuitry 22) using conductive lines such as patterned metal traces on a printed circuit substrate. Electrical components may have conductive contacts (terminals) that can be electrically connected to mating contact pads on a printed circuit. The contact pads on the printed circuit may be formed from patterned metal traces. Conductive adhesive, solder, or other conductive connections may be used in mounting the electrical components to the contacts on the printed circuit. The printed circuit may be a rigid printed circuit board (e.g., a printed circuit board formed from fiberglass-filled epoxy or other rigid printed circuit board material) or may be a flexible printed circuit (e.g., a flex circuit formed from a layer of polyimide or a sheet of other flexible polymer).

An electrical component that has been attached to a flexible printed circuit may be installed within housing 12 of device 10 so that the component bears against a particular surface or is otherwise mounted in a particular desired location within device 10. As an example, a camera or light sensor may be mounted against the inner surface of a display cover layer in alignment with a light window in the display cover layer. Proper operation of the camera or light sensor in this type of arrangement benefits from ensuring that the camera or light sensor is mounted against the display cover layer. Adhesive may be used in mounting the electrical component. In addition to using adhesive to attach the electrical component in a desired position or instead of using adhesive, it may be desirable to use a biasing structure such as a spring structure based on one or more flexible printed circuits to bias the electrical component into a desired position. For example, a flexible printed circuit may be bent to form a flexible printed circuit spring that biases a camera or light sensor outwards against the inner surface of a display cover layer. A flexible printed circuit spring that is formed in this way may be used to bias an electrical component against a display, a portion of housing 12, or other structures in device 10. The electrical component that is biased in a desired direction using the flexible printed circuit may be an input-output device such as a camera or light sensor or may be any other electrical component or structure within device 10.

Figure 3:
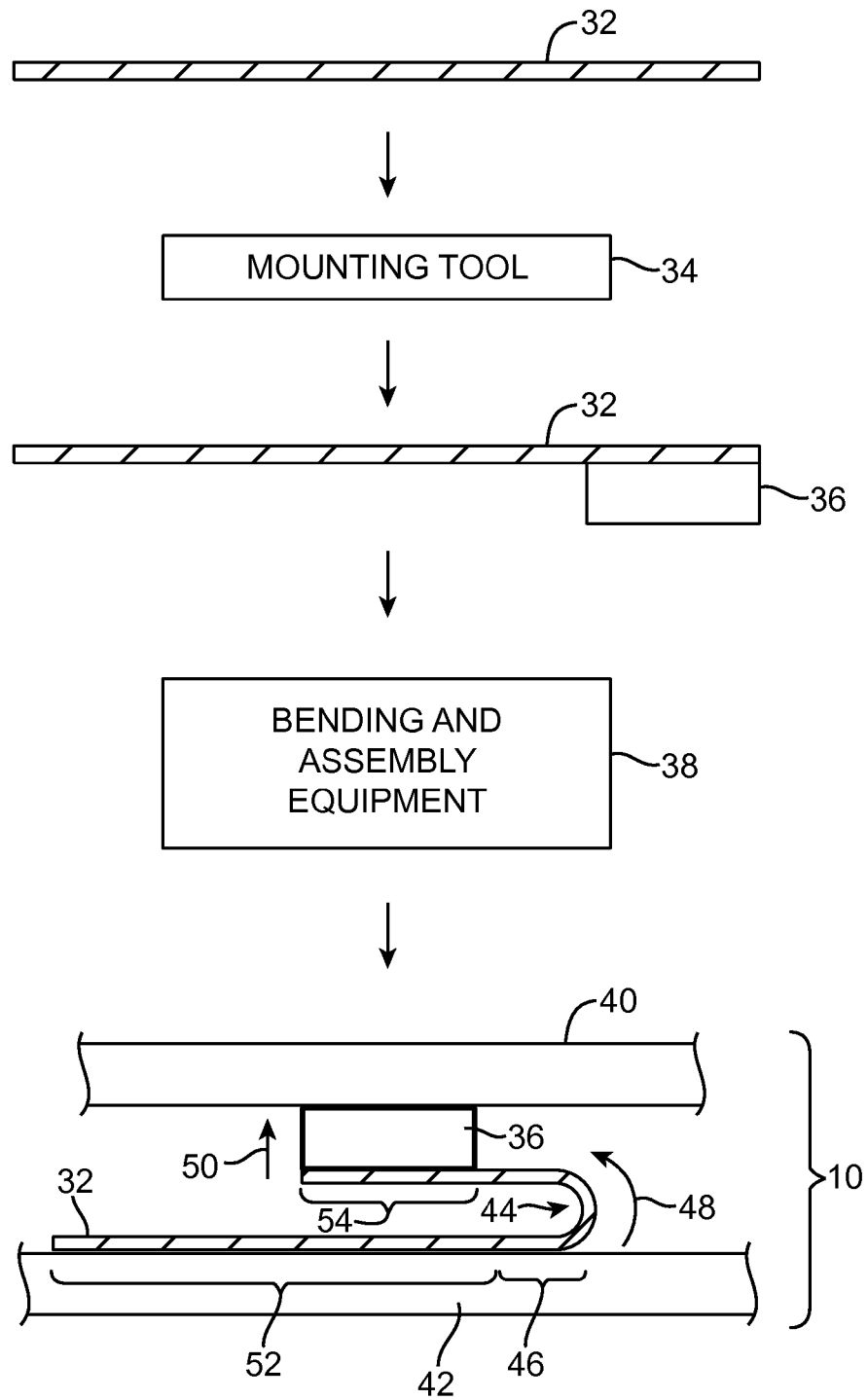
FIG. 3 is a cross-sectional side view of structures and equipment involved in assembling an electronic device with a biasing structure in accordance with an embodiment.

FIG. 3 is a system diagram showing how a flexible printed circuit may be bent to form a flexible printed circuit biasing structure that biases an electrical component in device 10 in a desired direction. As shown in FIG. 3, equipment such as mounting tool 34 may be used to mount one or more electrical components such as electrical component 36 to flexible printed circuit 32. Electrical component 36 may be an input-output device such as a camera, light sensor, or other electrical component. Flexible printed circuit 32 may contain conductive paths formed from patterned metal traces that are used in coupling electrical component 36 to other circuitry in device 10. Mounting tool 34 may be used to form solder joints, conductive adhesive connections, or other conductive connections between terminals on component 36 and mating contact pads on flexible printed circuit 32. Mounting tool 34 may include, for example, pick and place soldering equipment for soldering electrical components such as component 36 to printed circuits such as flexible printed circuit 32.

Bending and assembly equipment 38 may include computer-controlled positioners and/or manually controlled assembly tools for bending flexible printed circuit 32 into a shape that allows flexible printed circuit 32 to serve as a biasing structure (i.e., a flexible printed circuit spring). Bending and assembly equipment 38 may be used to form a spring or other biasing structure by bending flexible printed circuit 32 to form bent (spring) portion 46. Bending and assembly equipment 38 may also be used in installing flexible printed circuit 32 and electrical components such as electrical component 36 within device 10.

As shown in FIG. 3, device 10 may include structures such as structures 40 and 42. Structures 40 and 42 may include electrical components, housing structures 12, or other structures in device 10. For example, structure 42 may be a rear housing wall or an internal component or support structure and structure 40 may be a display cover layer, a portion of housing 12, or other internal structure within device 10. In general, structure 40 and/or structure 42 may be an input-output device, other electrical components, structures formed from metal, plastic, carbon-fiber composites and other fiber composite materials, structures formed from glass, structures formed from ceramic, frame members, planar sheets of material (e.g., a metal midplate in a housing, a planar display layer, a planar housing wall, a planar glass or plastic layer, etc.), mounting brackets, plastic and metal support structures (e.g., parts of housing 12 and/or other structures in device 10), or other suitable portions of device 10.

When mounted as shown in FIG. 3, flexible printed circuit 32 may have one or more planar (unbent) portions such as illustrative planar portion 52 on structure 42 and planar portion 54 supported by structure 42 (e.g., device housing 12 or other electronic device structure) under component 36. Portions 52 and 54 may be separated by an air gap, which can help avoid damage to sensitive structures in component 36 that might arise when using a foam basing configuration that fills the air gap.

Bent portion 42 of flexible printed circuit 32 is formed by using equipment 38 to bend flexible printed circuit 32 about bend axis 44 in direction 48. Flexible printed circuit 32 preferably has one or more bends that form bent portion 46 (sometimes referred to as spring portion or bend). Bent portion 46 causes flexible printed circuit 32 to serve as a spring biasing structure, because the dielectric substrate material of flexible printed circuit 32 is resilient and attempts to unbend flexible printed circuit 32 (i.e., the polyimide or other flexible polymer of flexible printed circuit 32 is elastomeric and due to its resilient nature, resists bending in direction 48 while attempting to unbend in direction 50). The unbending force exerted by flexible printed circuit 32 serves as a biasing force (spring force) that presses electrical component 36 in direction 50 against structure 40. Planar portion 52 of flexible printed circuit bears against the underlying portion of structure 42 in the opposite direction (i.e., downward in the orientation of FIG. 3).

The use of flexible printed circuit 32 to form a spring that biases electrical component 36 in a desired direction allows electrical component 36 to be mounted accurately within device 10 without using potentially damaging mounting structures and may help reduce part count and assembly challenges.

The strength of the unbending force that is generated by bend 46 in flexible printed circuit 32 can be adjusted by adding one or more resilient layers to flexible printed circuit 32, by adjusting the shape and size of flexible printed circuit 32, and/or by otherwise adjusting the configuration of the spring structures formed from flexible printed circuit 32.

Figure 4:
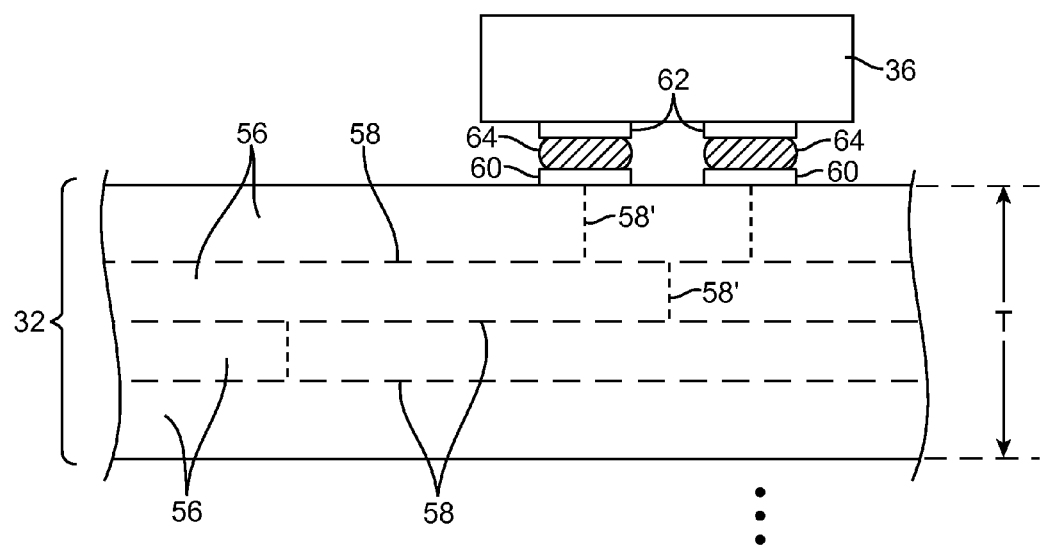
FIG. 4 is a cross-sectional side view of a portion of a flexible printed circuit showing how a component may be mounted to the flexible printed circuit in accordance with an embodiment.

A cross-sectional side view of flexible printed circuit 32 and an electrical component that has been mounted to flexible printed circuit 32 is shown in FIG. 4. As shown in FIG. 4, electrical component 36 may have terminals such as metal contacts 62 (sometimes referred to as contact pads). Contacts 62 of electrical component 36 may be connected to corresponding contacts 60 on flexible printed circuit 32. Contacts 60 (sometimes referred to as contact pads) may be formed from patterned metal traces on the surface of flexible printed circuit 32. Electrical connections 64 may be used in electrically and mechanically joining component contacts 62 to flexible printed circuit contacts 60 on flexible printed circuit 32. Electrical connections 64 may be formed from conductive material such as conductive adhesive or solder. As one example, electrical component 36 may be mounted on flexible printed circuit 32 by soldering electrical component 36 to contacts 60. There may be one or more electrical components 36 that are mounted to flexible printed circuit 32 (e.g., one or more, two or more, three or more, four or more, ten or more, etc.).

Flexible printed circuit 32 may contain multiple layers of dielectric (sometimes referred to as sublayers) such as layers 56. Layers 56 may have a collective thickness T (i.e., the thickness of the polymer substrate that forms flexible printed circuit 32 may be T). Layers 56 may be formed from polymers such as polyimide. Patterned layers of conductive material such as patterned metal layers 58 may be interposed between respective dielectric layers 56. Contacts 60 may be formed form a patterned metal layer on the surface of the uppermost dielectric layer 56 in flexible printed circuit 32 (i.e., contacts 60 may form part of one of the patterned metal layers in circuit 32). Vertical conductive pathways may be formed from patterned metal structures such as vias 58'. The patterned metal traces on flexible printed circuit 32 may be used to electrically connect components such as electrical component 36 with other electrical components 36 mounted on flexible printed circuit 32 and/or with other circuitry in device 10. Flexible printed circuit 32 may be coupled to other printed circuits in device 10 such as a main logic board formed from rigid printed circuit board material. Connectors and electrical connections formed form solder joints and conductive adhesive may be used in interconnecting flexible printed circuit 32 with other printed circuits.

The elasticity of flexible printed circuit 32 (i.e., the springiness of bend 44 and the amount of resulting biasing force that is produced to press component 36 in a desired direction) may be affected by the properties of the dielectric material used in forming layers 56 (e.g., the stiffness of the polyimide or other polymer used in forming layers 56), may be affected by the thickness T of flexible printed circuit 32, may be affected by the type of metal used in forming traces 58, may be affected by the thickness and layout of each layer of traces 58, and may be affected by other factors (e.g., the presence or absence of additional layers of material on flexible printed circuit 32). In some applications, it may be desirable to configure the biasing structures formed from flexible printed circuit 32 so that a relatively light biasing force is generated (e.g., a small biasing force may be desirable in a situation in which too much force could tend to disassemble parts). In other applications, it may be desirable to configure the biasing structures formed from flexible printed circuit 32 so that a relatively larger biasing force is generated (e.g., a large biasing force may be desired in a situation in which component 36 is heavy or is prone to accidental dislodgement and therefore can benefit from a larger force to help restore component 36 to its desired location).

If desired, one or more coatings or other layers of material may be attached to flexible printed circuit 32 to enhance the springiness of flexible printed circuit 32. As an example, one or more additional layers of material such as additional layer 66 of FIG. 5 may be attached to flexible printed circuit 32. Additional layer 66 may be a layer of polymer (e.g., a sheet of polyimide or other plastic layer), a layer of foam, a layer of metal (e.g., spring metal), a layer of fiber-composite material, two or more of these layers, or other material that helps increase the amount of restoring force in direction 50 that is generated as bend 46 attempts to unbend about bend axis 44.

Figure 5:
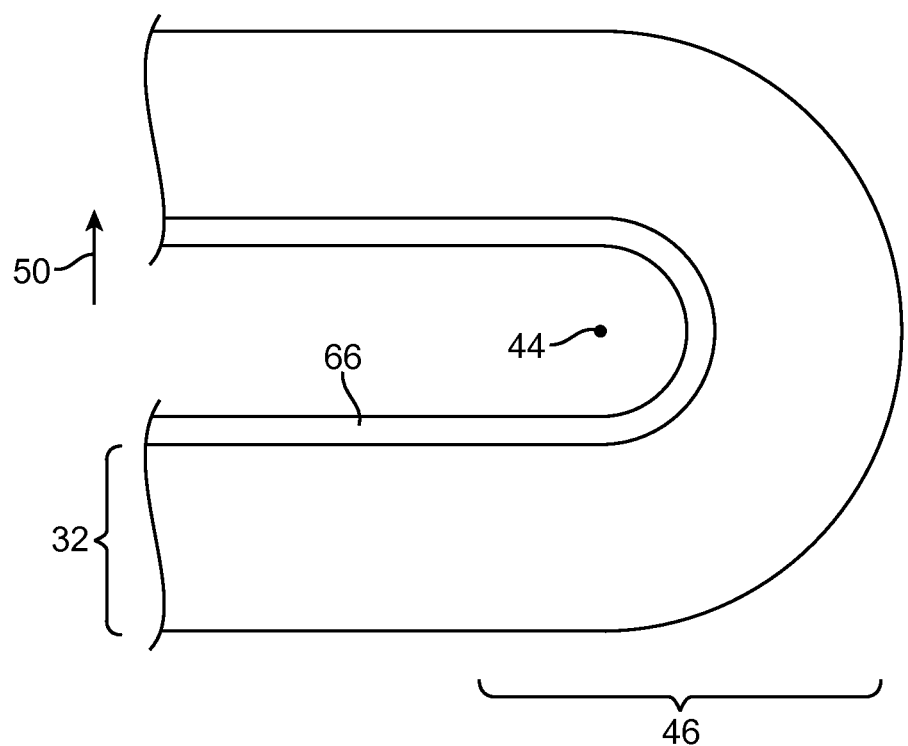
FIG. 5 is a cross-sectional side view of an illustrative flexible printed circuit that has been bent about a bend axis to form a spring and that has an inner layer of additional material to enhance biasing force in accordance with an embodiment.
Figure 6:
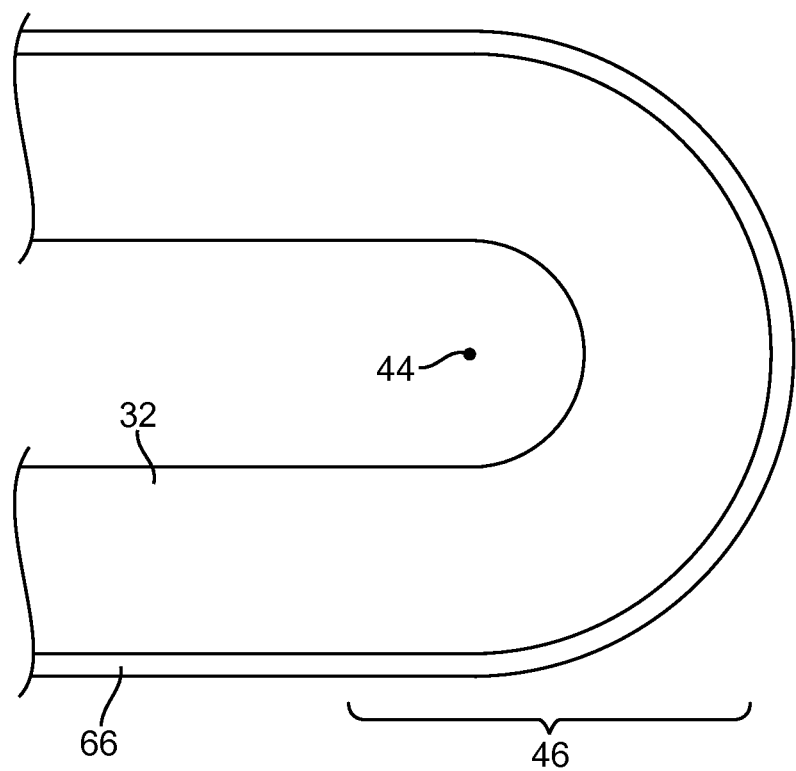
FIG. 6 is a cross-sectional side view of an illustrative flexible printed circuit that has been bent about a bend axis to form a spring and that has an outer layer of additional material to enhance biasing force in accordance with an embodiment.
Figure 7:
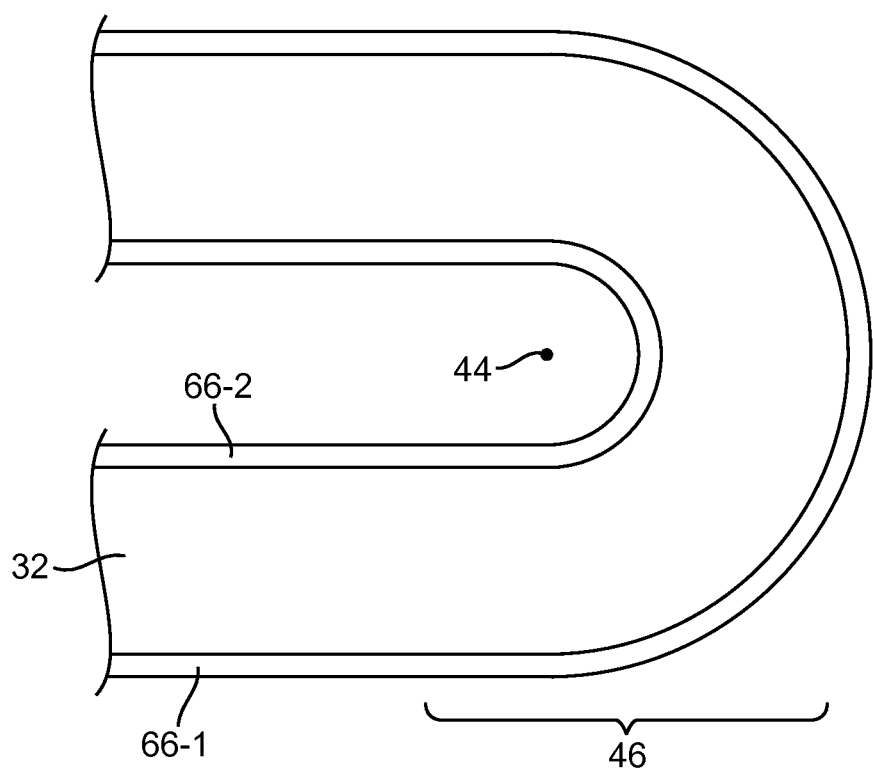
FIG. 7 is a cross-sectional side view of an illustrative flexible printed circuit that has been bent about a bend axis to form a spring and that has inner and outer layers of additional material to enhance biasing force in accordance with an embodiment.
Figure 8:
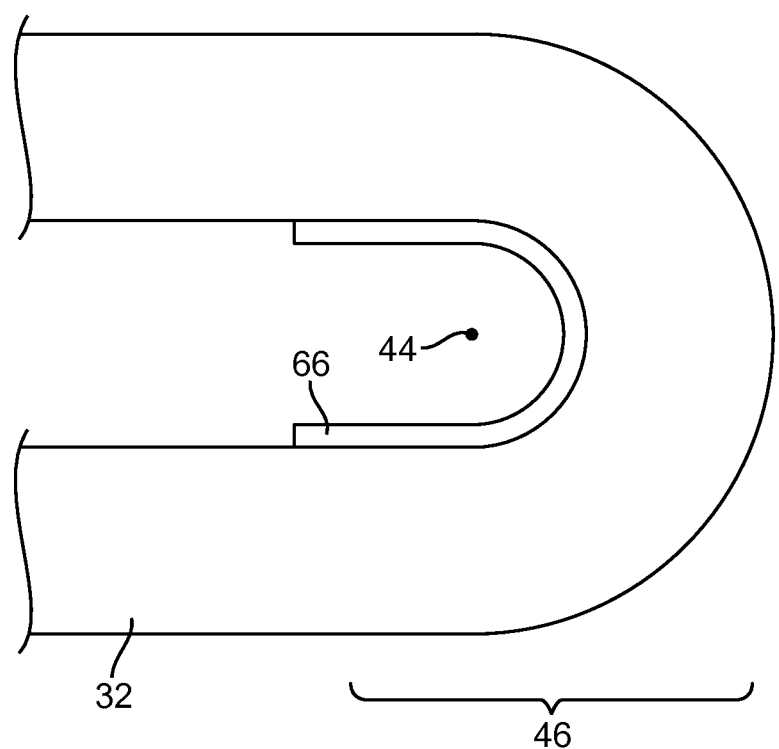
FIG. 8 is a cross-sectional side view of an illustrative flexible printed circuit that has been bent about a bend axis to form a spring and that has an inner layer of additional material that covers the bent portion of the flexible printed circuit in accordance with an embodiment.

In the configuration of FIG. 5, additional layer 66 is formed on the inner bend surface of flexible printed circuit 32 (i.e., the surface of flexible printed circuit 32 that faces bend axis 44). FIG. 6 is a cross-sectional side view of flexible printed circuit 32 in a configuration in which additional layer 66 has been formed on the outer bend surface of bent portion 46 (i.e., the surface of flexible printed circuit 32 that faces away from bend axis 44). The cross-sectional side view of FIG. 7 shows how additional material 66 may be formed on both the inner and outer bend surfaces of bent portion 46. Additional layer 66-2 is formed on the inner bend surface of flexible printed circuit 32 and additional layer 66-1 is formed on the outer bend surface of flexible printed circuit 32. If desired, additional material 66 (i.e., a layer on the inner or outer bend surfaces of flexible printed circuit 32 or both) may be restricted to bent portion 46 of flexible printed circuit 32, as shown in the cross-sectional side view of FIG. 8.

Figure 9:
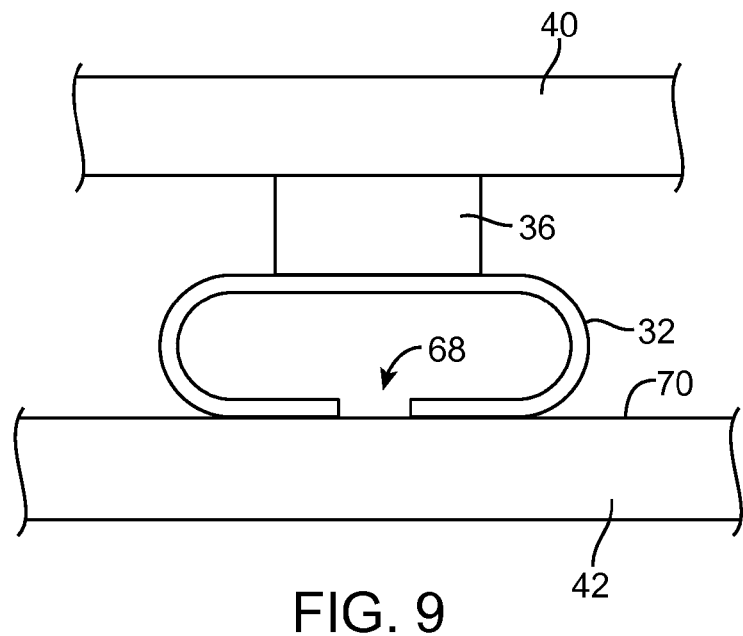
FIG. 9 is a cross-sectional side view of an illustrative flexible printed circuit that has been bent into a downward-facing C-shaped configuration to form a biasing structure for a component in accordance with an embodiment.
Figure 10:
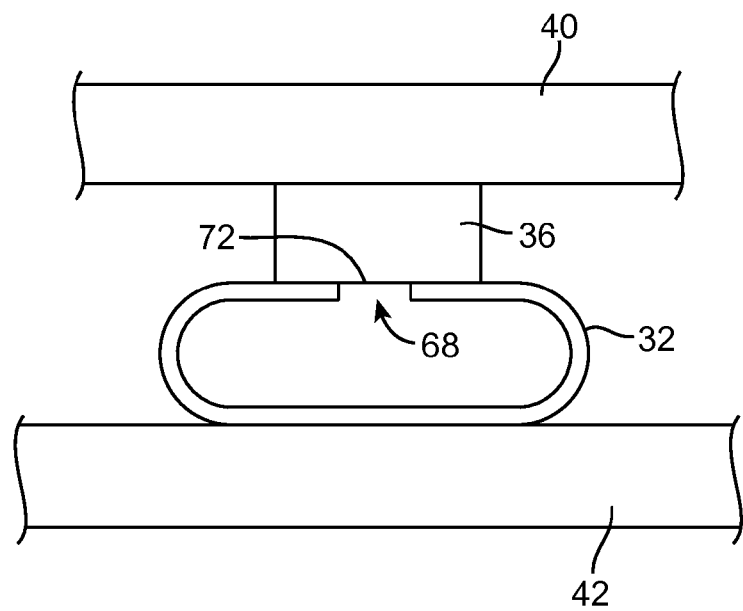
FIG. 10 is a cross-sectional side view of an illustrative flexible printed circuit that has been bent into an upward-facing C-shaped configuration to form a biasing structure for a component in accordance with an embodiment.

As shown in the illustrative configuration of FIG. 9, flexible printed circuit 32 may be bent into a downward-facing C-shape to form a flexible printed circuit spring. Gap 68 in flexible printed circuit 32 may rest on upper surface 70 of structure 42. Component 36 may be biased upwards against structure 40 (in the orientation of FIG. 9) by flexible printed circuit 32. In the illustrative configuration of FIG. 10, flexible printed circuit 32 has been configured to form an upwards-facing C-shaped spring that biases component 36 against structure 40. Gap 68 in flexible printed circuit 32 of FIG. 10 lies on lower surface 72 of component 36. Metal lines or other traces on structures 42 (e.g., printed circuit board traces in configurations in which structures 42 include a printed circuit) may be electrically connected to traces in flexible printed circuit 32 using solder, conductive adhesive, etc. Multiple components 36 may be connected to printed circuit 32 if desired (e.g., one component may be coupled to one end of flexible printed circuit 32 in FIG. 10 and another component may be coupled to the other end of flexible printed circuit 32 in FIG. 10).

Figure 11:
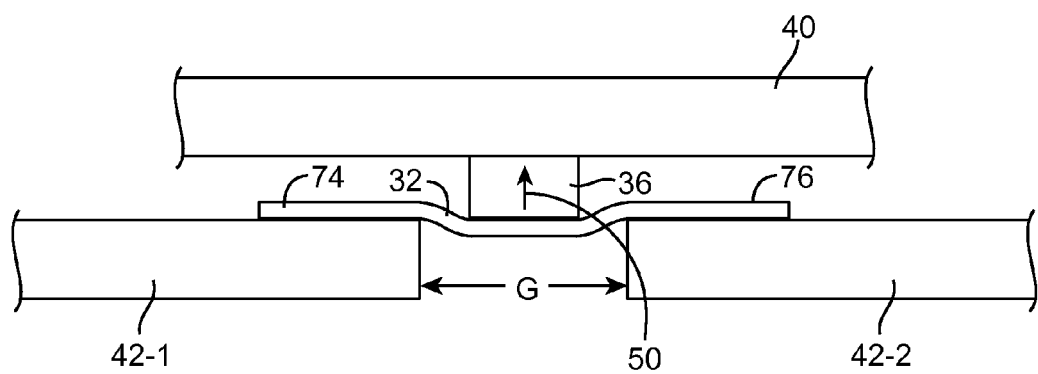
FIG. 11 is cross-sectional side view of an illustrative flexible printed circuit that has been extended across a gap between two structures to form a biasing structure for a component in accordance with an embodiment.

FIG. 11 is a cross-sectional side view of flexible printed circuit 32 in a configuration in which flexible printed circuit 32 has opposing ends that are coupled to opposing structures on either side of gap G. End 74 of flexible printed circuit 32 is coupled to structure 42-1 and opposing end 76 is coupled to structure 42-1. Structures 42-1 and 42-2 may be separate structures or may be part of the same structure (i.e., gap G between structures 42-1 and 42-2 may be a gap separating two independent structures or may be a hole or other opening in a unitary structure). When configured as shown in FIG. 11, flexible printed circuit 32 may have bends that help flexible printed circuit 32 serve as a biasing structure that biases electrical component 36 upwards in direction 50.

Figure 12:
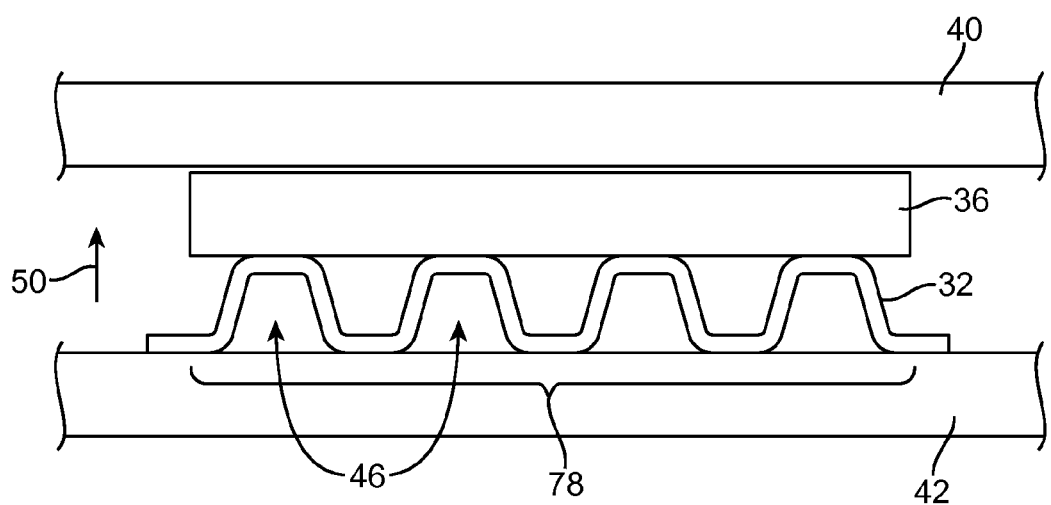
FIG. 12 is a cross-sectional side view of an illustrative flexible printed circuit with a corrugated shape having multiple corrugations forming a biasing structure for a component in accordance with an embodiment.

FIG. 12 is a cross-sectional side view of an illustrative configuration in which a flexible printed circuit biasing structure has been formed from a corrugated flexible printed circuit. As shown in FIG. 12, flexible printed circuit 32 has multiple bends 46, so that flexible printed circuit 32 extends between structures 42 and electrical component 36 over distributed spring area 78. In this configuration, the corrugations in flexible printed circuit 32 allow flexible printed circuit 32 to serve as a distributed spring that biases electrical component 36 upwards in direction 50 against structure 40 (i.e., in a direction perpendicular to the plane of corrugated flexible printed circuit 32).

Figure 13:
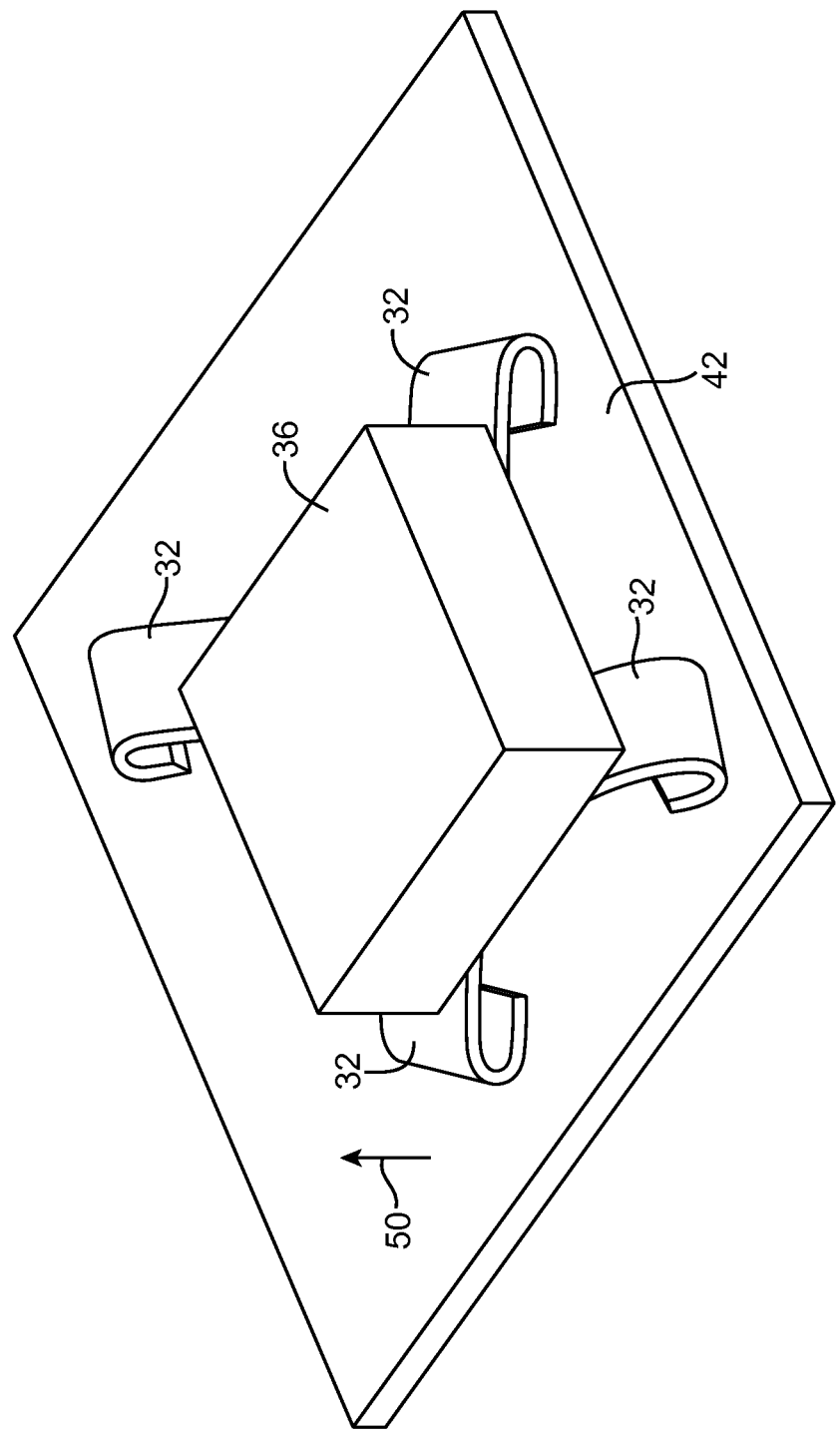
FIG. 13 is a perspective view of a component that is being biased upwards by biasing structures formed from multiple bent flexible printed circuits tails extending outwards from under the component in accordance with an embodiment.

If desired, flexible printed circuit 32 may have multiple tails that extend outward from under component 36. As shown in FIG. 13, for example, flexible printed circuit 32 may be formed from one or more sections that form bent flexible printed circuit springs at the corners of electrical component 36. There may be four tails to flexible printed circuit 32 as shown in FIG. 13 or there may be fewer than four tails or more than four tails. Each tail may form a respective biasing spring. The tails may be part of a common flexible printed circuit or some or all of the tails may be formed from individual flexible printed circuits. With a configuration of the type shown in FIG. 13, each bent tail portion of flexible printed circuit 32 may serve as a biasing leg that supports a respective corner of electrical component 36 and that biases electrical component 36 upwards in direction 50 against structure 40.

Figure 14:
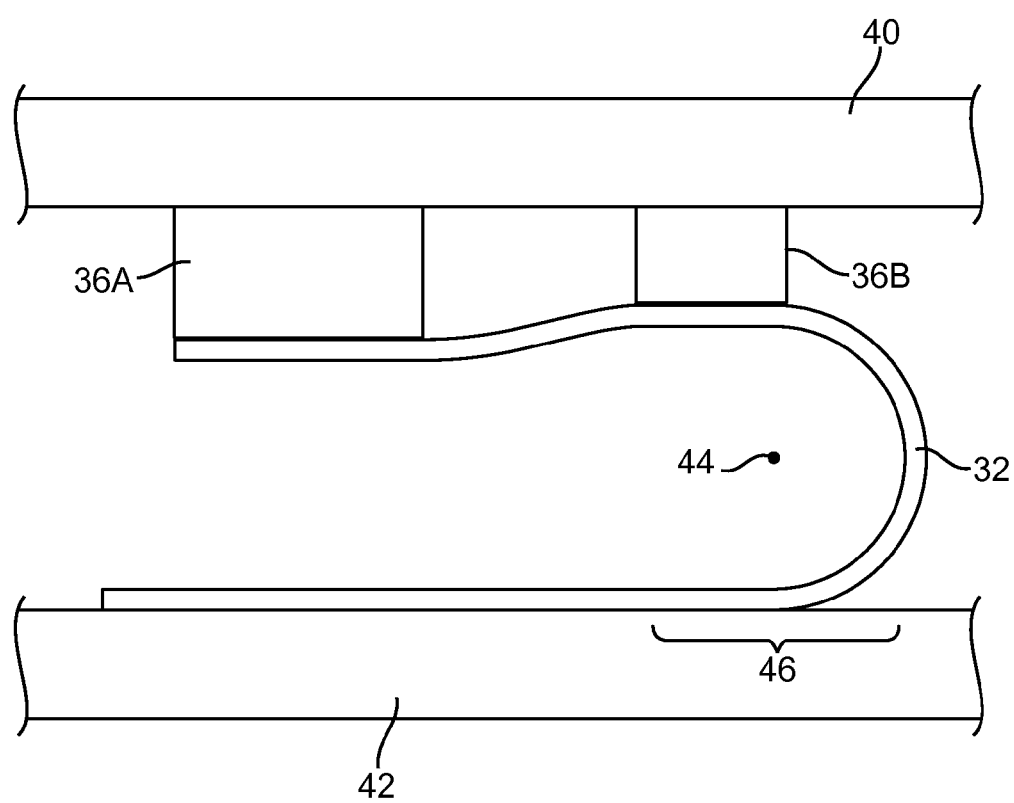
FIG. 14 is a cross-sectional side view of an illustrative flexible printed circuit that has been bent about a bend axis to form a spring that serves as a biasing structure for multiple components in accordance with an embodiment.

FIG. 14 is a cross-sectional side view of a biasing structure formed from a bent flexible printed circuit that is being used to bias multiple attached electrical components in direction 50 against structure 40. There are two electrical components (components 36A and 36B) in the example of FIG. 14. In general, any suitable number of electrical components may be mounted to flexible printed circuit 32 and biased in a desired direction by the spring formed by bending flexible printed circuit 32 (e.g., one or more electrical components may be biased in a desired direction, two or more electrical components may be biased in a desired direction, three or more electrical components may be biased in a desired direction, etc.).

Figure 15:
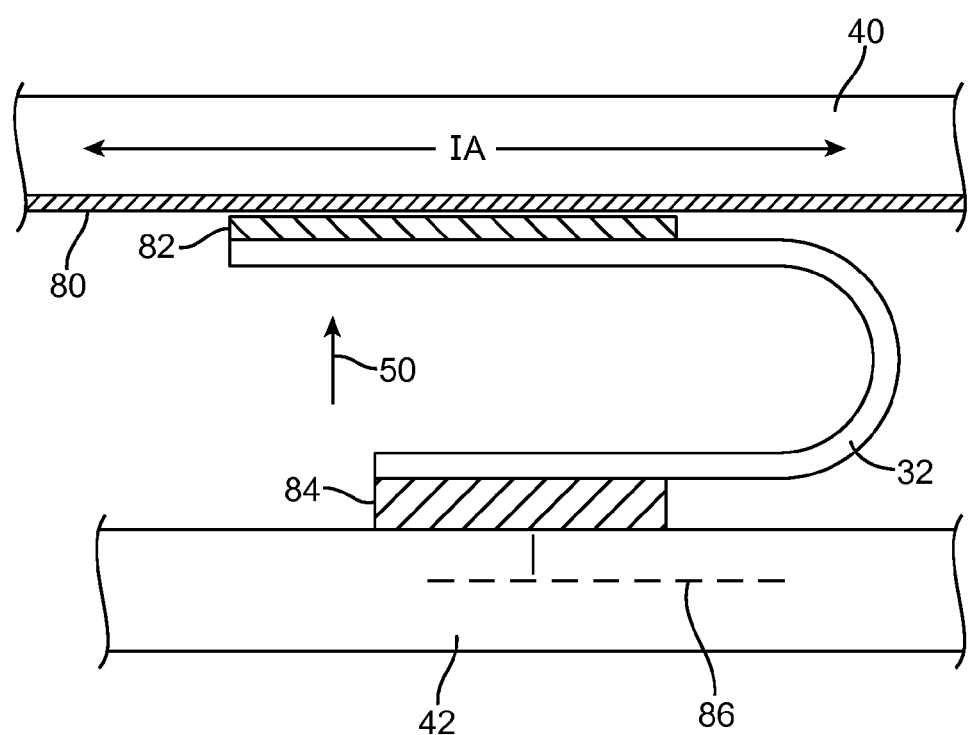
FIG. 15 is a cross-sectional side view of an illustrative flexible printed circuit on which an antenna has been formed and that has been bent to form a spring that biases the antenna against a surface such as a display cover layer in an electronic device in accordance with an embodiment.

The electrical component 36 on flexible printed circuit 32 may be an antenna structure (e.g., an antenna resonating element and/or an antenna ground that forms all or part of an antenna for device 10) formed from patterned metal traces on flexile printed circuit 32. This type of configuration is shown in FIG. 15. As shown in FIG. 15, antenna structure 82 may be formed from metal traces on the surface of flexible printed circuit 32. An opaque masking layer such as layer 80 (e.g., a layer of ink such as black ink) may be formed on the underside of display cover layer 40 (i.e., a portion of display 14 in inactive area IA). The spring formed from the bend in flexible printed circuit 32 biases antenna structure 82 upwards against opaque masking layer 80 and the underside of display cover layer 40 or other structure 40 (e.g., a housing wall in housing 12, an antenna window structure formed from a plastic member inset within an opening in a metal housing, etc.). Using the arrangement of FIG. 15 in which printed circuit 32 biases antenna structure 82 in a desired direction, the location of antenna structures 82 and therefore the performance of the antenna associated with structures 82 may be well controlled.

Flexible printed circuit 32 contains metal traces that serve as signal lines. These signal lines may be coupled to signal lines in printed circuit substrates and other structures. As shown in FIG. 15, for example, structure 42 may be a printed circuit or other substrate that includes patterned metal traces 86. Connection structure 84 may be used to couple the metal traces in printed circuit 32 to metal traces 86 in structure 42. Connection structures 84 may be conductive adhesive, solder, welds, a board-to-board connector or other connector, or other coupling structures.

Figure 16:
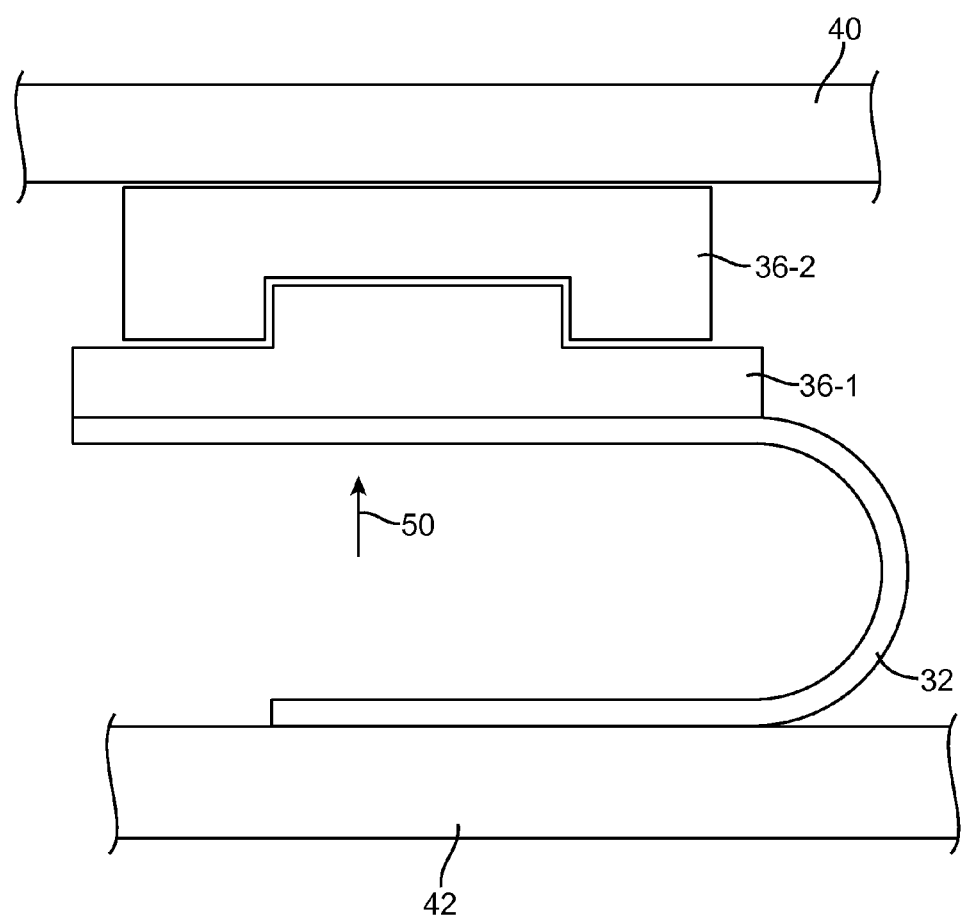
FIG. 16 is a cross-sectional side view of an illustrative flexible printed circuit that has been bent about a bend axis to form a spring that biases a first component into engagement with a second component in accordance with an embodiment.

In the example of FIG. 16, the biasing force exerted in direction 50 by bent flexible printed circuit 32 is being used to press electrical component 36-1 together with mating structure 36-2 (e.g., an alignment structure and/or a mating electrical component). Structure 36-2 may be mounted to the underside of structure 40 (e.g., using adhesive). Component 36-1 may be an optical component or other electrical component and structure 36-2 may be another electrical component, a mounting bracket or other alignment structure that is configured to receive component 36-1, may be a substrate that includes signal paths that mate with signal paths in component 36-1, or other structure.

Figure 17:
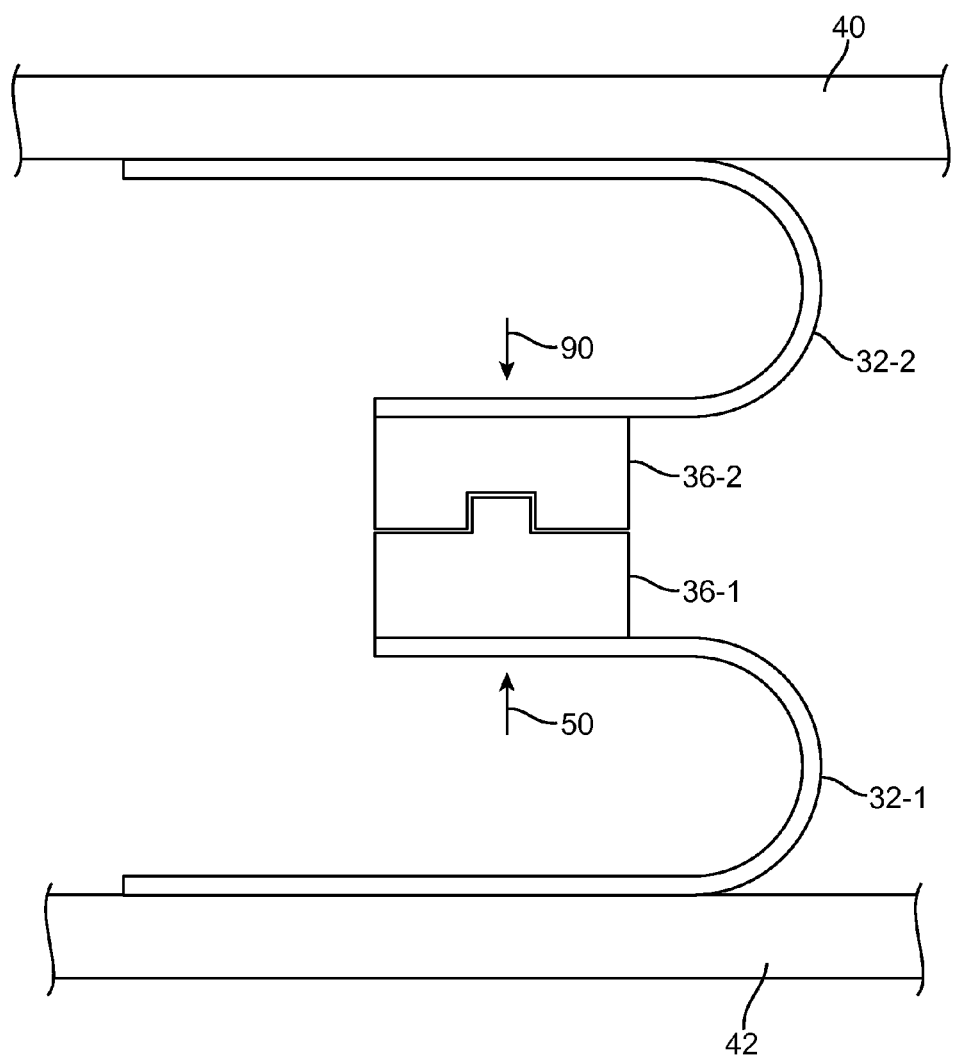
FIG. 17 is a cross-sectional side view of an illustrative pair of interlocking components that have been biased towards each other by bent flexible printed circuits in accordance with an embodiment.

FIG. 17 is a cross-sectional side view of mating structures 36-1 and 36-2. Structures 36-1 and 36-2 may be a pair of mating electrical components, an electrical component and a mating alignment structure or other structure, etc. Structures 36-1 and 36-2 may be biased towards each other using respective bent flexible printed circuits. In the illustrative configuration of FIG. 17, structure 36-1 is mounted on bent flexible printed circuit 32-1. Structure 36-2 is mounted on bent flexible printed circuit 32-2. The bend in flexible printed circuit 32-1 forms a biasing structure (flexible printed circuit spring) that biases structure 36-1 upwards in direction 50. The bend in flexible printed circuit 32-2 forms a biasing structure (flexible printed circuit spring) that biases structure 36-2 in an opposing downward direction (direction 90), thereby pressing the structures together.

Figure 18:
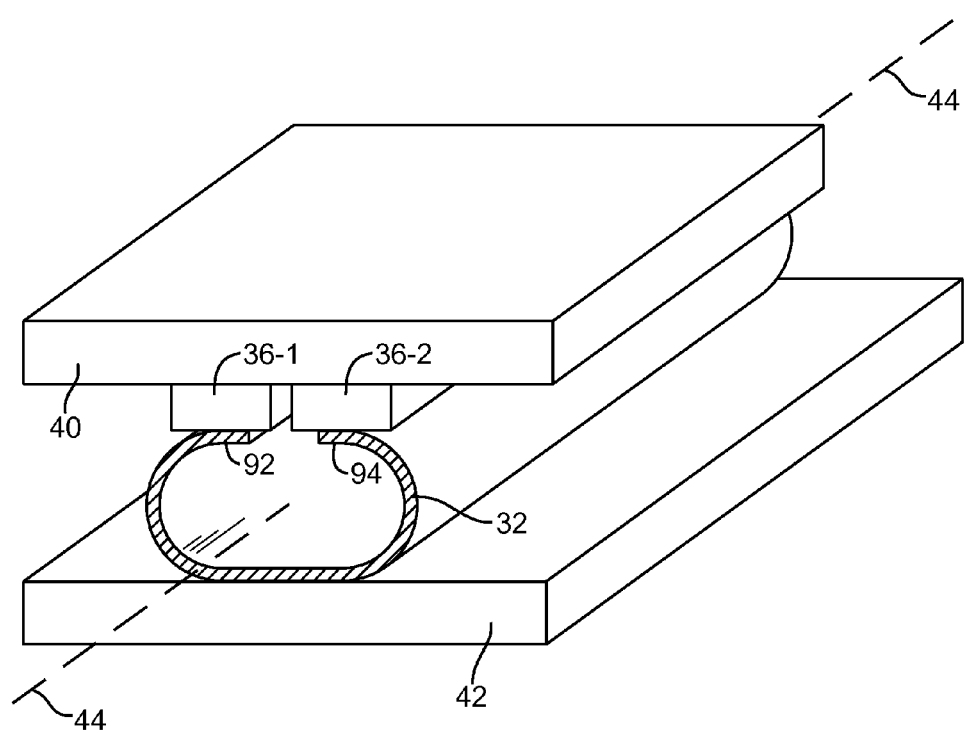
FIG. 18 is a perspective view of an illustrative flexible printed circuit that has been rolled into a tube to serve as a tube-shaped biasing structure in accordance with an embodiment.

FIG. 18 is a perspective view of an illustrative tube-shaped biasing structure formed from wrapping an elongated strip of flexible printed circuit 32 around bend axis 44. The edges of flexible printed circuit 32 may be coupled to the same electrical component or different electrical components. In the example of FIG. 18, edge 92 of flexible printed circuit 32 has been coupled to electrical component 36-1 and edge 94 has been coupled to electrical component 36-2.

Figure 19:
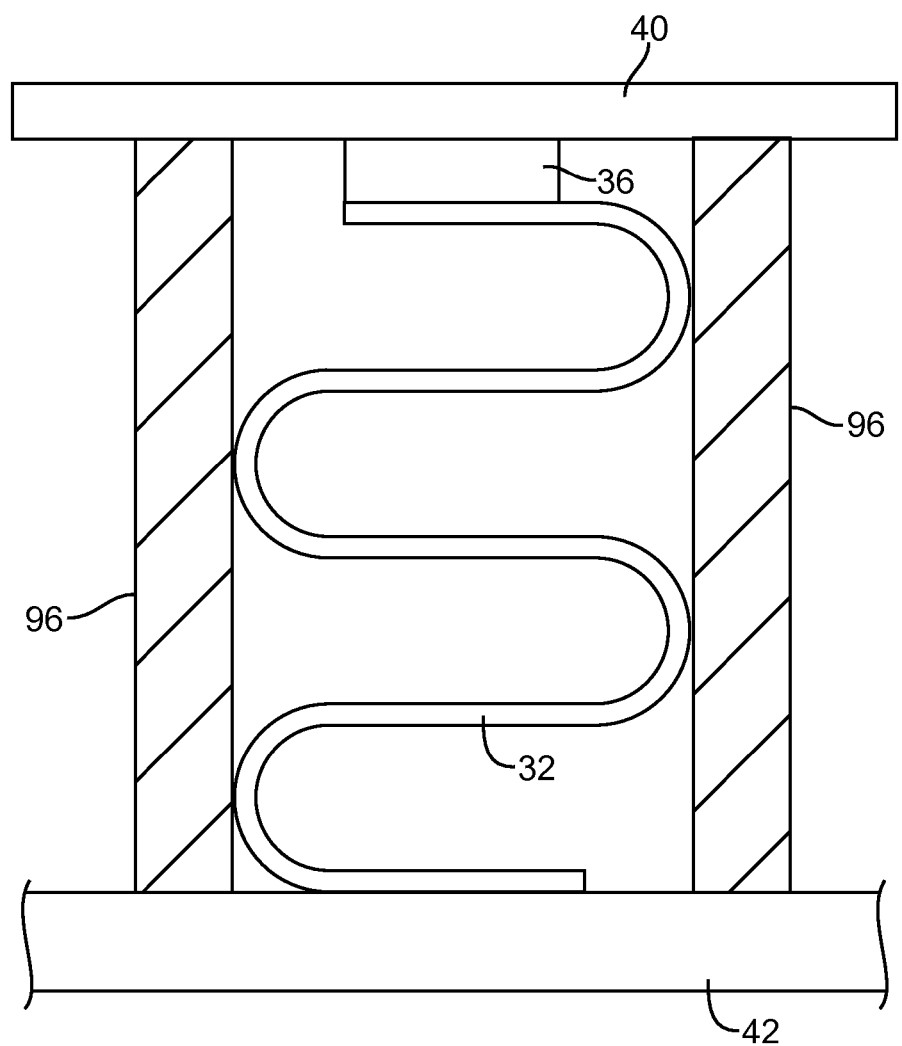
FIG. 19 is a cross-sectional side view of an illustrative flexible printed circuit that has been configured to form an accordion-shaped biasing structure in accordance with an embodiment.

FIG. 19 is a cross-sectional side view of an illustrative flexible printed circuit biasing structure formed by folding flexible printed circuit repeatedly into an accordion-shaped spring. Structures 96 may be plastic or metal members, parts of components, or other structures in device 10 that help to laterally constrain flexible printed circuit 32. When bent in the shape shown in FIG. 19, flexible printed circuit spring 32 biases electrical component 36 upwards in direction 50, parallel to the vertical dimension along which the accordion-shaped spring extends. There may be any desired number of flexible printed circuit bends (folds) in an accordion-shaped spring of the type shown in FIG. 19 (e.g., two or more, three or more, four or more, five or more, ten or more, etc.).

Figure 20:
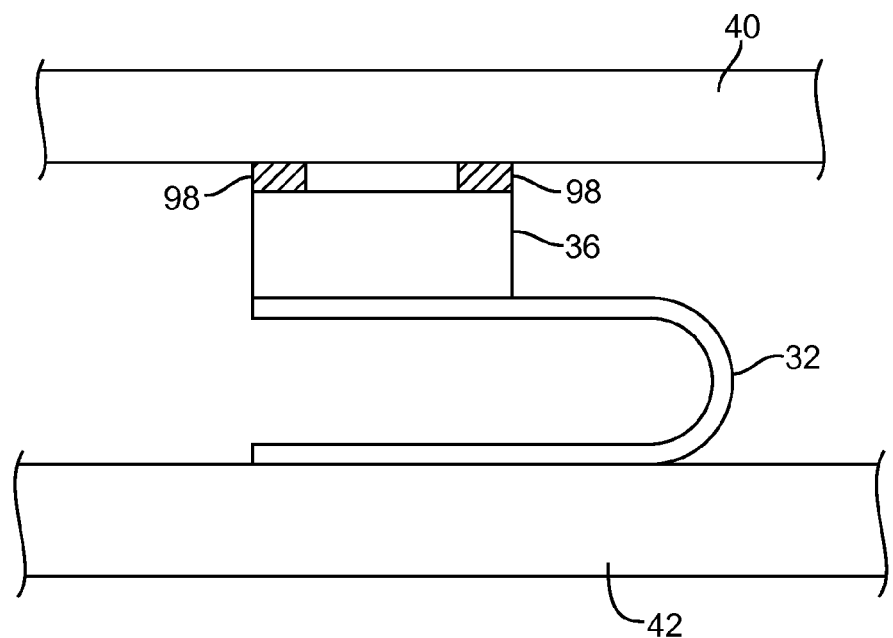
FIG. 20 is a cross-sectional side view of a portion of an illustrative electronic device in which a flexible printed circuit spring is biasing a component towards a desired mounting location in accordance with an embodiment.
Figure 21:
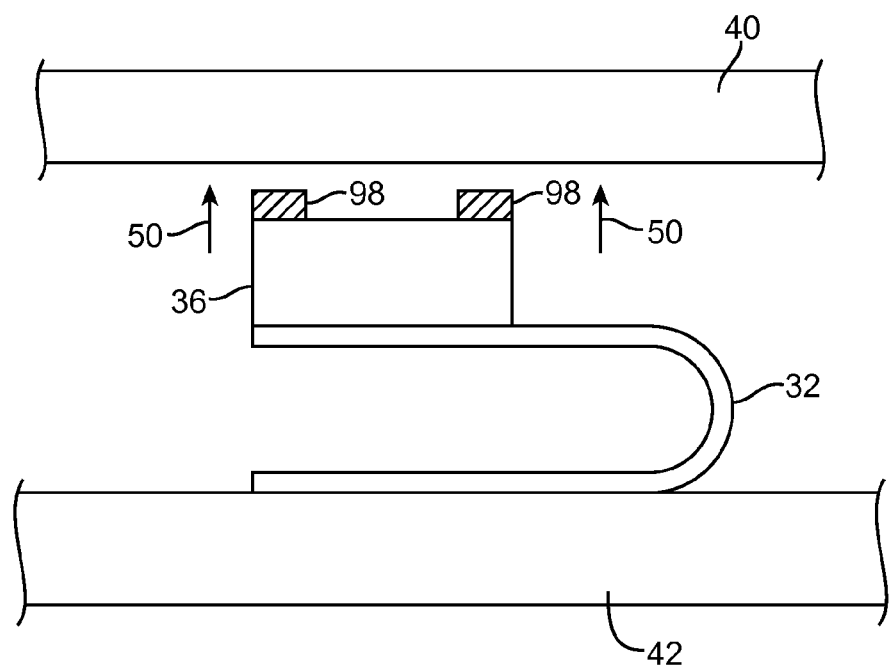
FIG. 21 is a cross-sectional side view of the portion of the illustrative electronic device of FIG. 20 showing how the flexible printed circuit spring helps restore the component to its desired mounting location in the event of failure of an adhesive bond between the component and device structures in accordance with an embodiment.

The biasing force produced by flexible printed circuit biasing structures may be sufficient to return electrical component 36 to a desired position within device 10 following an undesired drop event or other event producing stress on component 36. As shown in FIG. 20, adhesive 98 may be used to attach electrical component 36 to structure 40. In a drop event, the bond formed by adhesive 98 may fail, as shown in FIG. 21. In this situation, the biasing force in direction 50 that is produced by flexible printed circuit spring 32 can return electrical component 36 to its desired location against structure 40.

Figure 22:
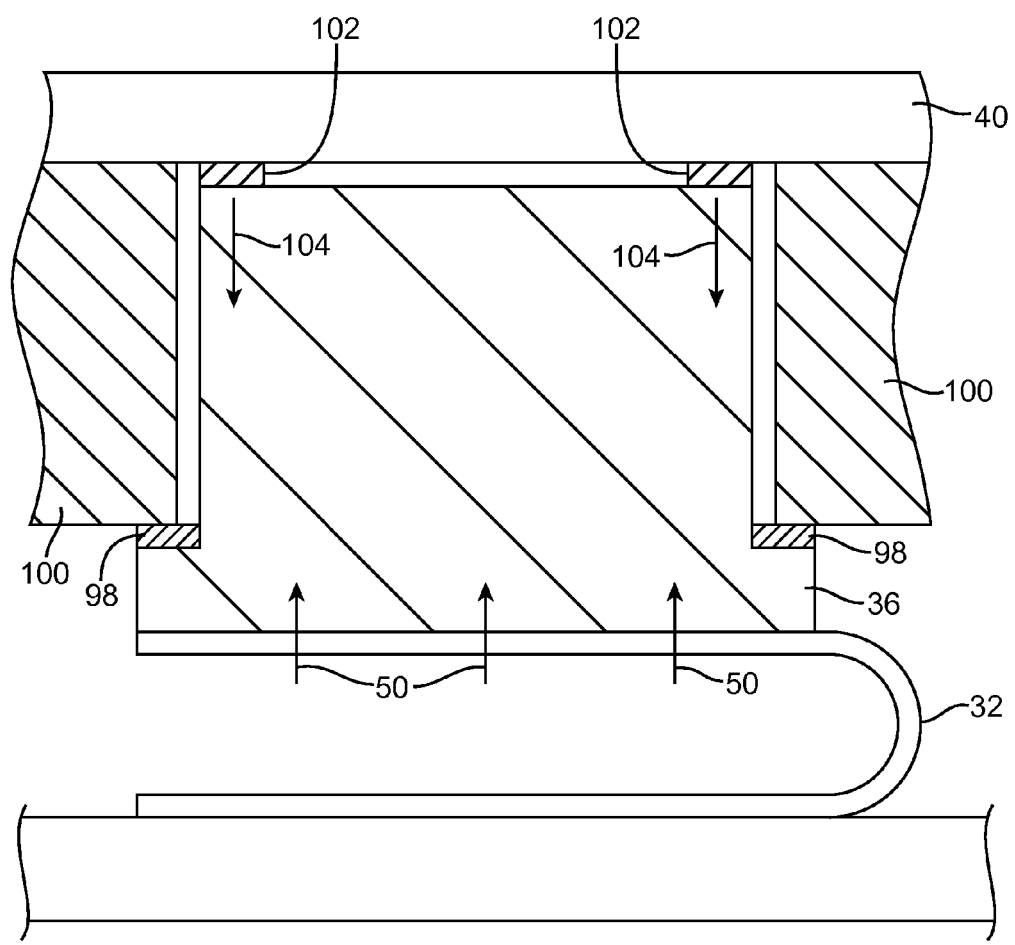
FIG. 22 is a cross-sectional side view of an illustrative component such as a camera that has been mounted in an electronic device using a foam gasket and a flexible printed circuit spring that helps counteract downward force from the foam gasket to minimize stress on an adhesive bond in accordance with an embodiment.

In some configurations, adhesive bonds may be weakened by opposing biasing forces from gaskets or other structures. As shown in FIG. 22, component 36 (e.g., a camera, light sensor, or other component in device 10) may be mounted to frame 100 (e.g., a structure that is attached to structure 40) by adhesive 98. Foam gasket 102 may be used to form a seal between structure 40 and component 36. Gasket 102 may, for example, have a ring shape with a central opening to permit light to reach component 36. Gasket 102 may bias component 36 downwards in direction 104, thereby tending to pull apart and weaken the bonds formed from adhesive 98. In the presence of flexible printed circuit biasing structure 32, an opposing upward biasing force on component 36 is produced in direction 50. The biasing force produce by flexible printed circuit 32 can be adjusted (e.g., by adjusting flexible circuit thickness, the incorporation of additional layers such as layer 66, etc.) so that biasing force 50 is greater than or equal to biasing force 104 (or so that biasing force at least partly counteracts downward force 104), thereby reducing the forces on adhesive bond 98 that might otherwise cause adhesive bond 98 to fail.

Figure 23:
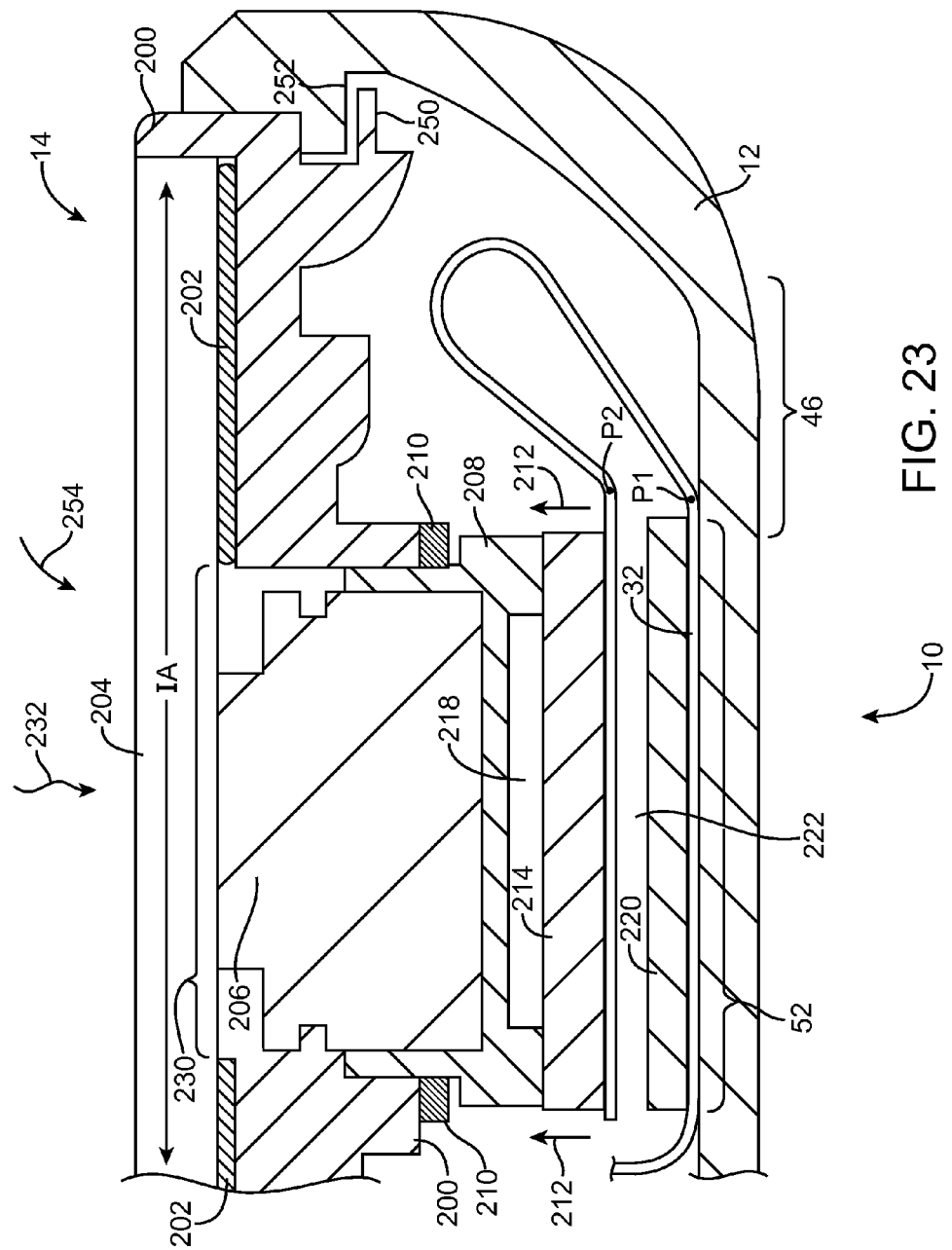
FIG. 23 is a cross-sectional side view of a portion of an illustrative electronic device in which a component such as a camera has been mounted under a camera window in a display cover layer using a flexible printed circuit spring with a service loop in accordance with an embodiment of the present invention.

FIG. 23 shows how flexible printed circuit 32 may be bent in a shape that creates excess length in bend region 46. The excess length is formed in the segment of flexible printed circuit 32 that extends between points P1 and P2 in FIG. 23. This excess length (i.e., the length in the flexible printed circuit segment that exceeds that needed to form a simple bend) can serve as a service loop that allows component 36 to be moved relative to device 10 during assembly and repair operations.

In the illustrative configuration of FIG. 23, electronic device 23 has display 14 mounted on the front face of housing 12 using frame 200 (e.g., a plastic frame member). Frame 200 may be attached to display cover layer 204 using adhesive. An opaque masking layer may be formed on the underside of display cover layer 204 in inactive area IA. The opaque masking layer and adhesive for attaching frame 200 to display cover layer 204 are depicted as layer 202 in FIG. 23. Light opening 230 in the opaque masking layer and adhesive layer 202 may permit light 232 to reach digital image sensor 214. Digital image sensor 214 may be mounted (e.g., soldered) to flexible printed circuit 32 and may form part of a camera module.

The camera module may include camera body 206 mounted in camera holder 208. Camera body 206, camera holder 208, and image sensor 214 may be press-fit together, may be attached using engagement features such as clips and springs, may be attached using screws or other fasteners, may be attached using plastic welds, may be attached using adhesive, may be attached using other coupling mechanisms, or may be attached using two or of these techniques.

An adhesive such as pressure sensitive adhesive 210 may be used to attach the camera of device 10 (or other electrical component 36) to housing 12 (by way of attachment to an internal housing structure such as frame 200, which is mounted in housing 12). The flexible printed circuit biasing structures formed from flexible printed circuit 32 (i.e., the flexible printed circuit spring formed by bending flexible printed circuit 32 in bend region 46) biases image sensor 214 and other portions of the camera such as camera holder 208 and camera body 206 upwards in direction 212, thereby helping to secure the adhesive bond formed by adhesive 210. If desired, the flexible printed circuit biasing structures formed from flexible printed circuit 32 of FIG. 23 may be used to help counteract downward biasing forces from a foam gasket between body 206 and display cover layer 204, as described in connection with FIG. 22. The biasing force in direction 212 that is produced by flexible printed circuit 32 may also help reseat the camera against display cover layer 204 in the event that adhesive 210 fails during a drop event.

Air gap 218 may separate camera holder 208 from image sensor 214. Air gap 222 may separate image sensor 214 on flexible printed circuit 32 from underlying portions of flexible printed circuit 32 and from optional radio-frequency absorber 220 for reducing radio-frequency interference. The underlying flexible printed circuit portions under air gap 222 (i.e., the portion of flexible printed circuit 32 that is overlapped by the camera or other electrical component on flexible printed circuit 32) include planar flexible printed circuit portion 52 mounted on the inner surface of housing 12 or other device structures.

During assembly operations, frame 200 may be attached to display cover layer 204 to form a display assembly. The camera may then be installed in the display assembly. Toe portion 250 of the display assembly may be received under ledge 252 so that the display assembly may be installed within device housing 12 by rotation in direction 254. The service loop in bent portion 46 of flexible printed circuit 32 may help accommodate rotation of the display assembly as device 10 is being assembled.

The foregoing is merely illustrative and various modifications can be made by those skilled in the art without departing from the scope and spirit of the described embodiments. The foregoing embodiments may be implemented individually or in any combination.

What is claimed is:

1. Apparatus, comprising:
    a display cover layer;
    a flexible printed circuit having a bend that forms a flexible printed circuit spring; and
    an electrical component mounted to the flexible printed circuit between the flexible printed circuit and the display cover layer, wherein the flexible printed circuit spring biases the electrical component towards the display cover layer.

2. The apparatus defined in claim 1 wherein the electrical component comprises a light sensor selected from the group consisting of: a light-based proximity sensor and an ambient light sensor.

3. The apparatus defined in claim 1 wherein the electrical component comprises a camera.

4. The apparatus defined in claim 3 further comprising:
    a frame attached to the display cover layer; and
    adhesive that attaches the camera to the frame.

5. The apparatus defined in claim 3 further comprising:
    an electronic device housing structure, wherein a planar portion of the flexible printed circuit is supported by the electronic device housing structure and wherein there is an air gap between the camera and the planar portion of the flexible printed circuit.

6. The apparatus defined in claim 5 further comprising adhesive attached to the camera.

7. The apparatus defined in claim 5 further comprising a foam gasket interposed between the camera and the display cover layer.

8. An electronic device, comprising:
    a housing;
    a display mounted in the housing;
    a flexible printed circuit biasing structure formed from a flexible printed circuit with a bend; and
    an electrical component that is biased towards the display by the flexible printed circuit biasing structure, wherein the flexible printed circuit has a portion that is overlapped by the electrical component and that is separated from the electrical component by an air gap, and wherein the electrical component comprises a light-sensitive component that gathers information based on light received at the light-sensitive component.

9. The electronic device defined in claim 8 wherein the display includes a display cover layer, the electronic device further comprising:
    an opaque masking layer on the display cover layer, wherein the opaque masking layer has a light opening and wherein the electrical component is in alignment with the light opening.

10. The electronic device defined in claim 9 further comprising a foam gasket between the electrical component and the display cover layer.

11. The electronic device defined in claim 9 wherein the light-sensitive component comprises a camera.

12. The electronic device defined in claim 8 wherein the portion of the flexible printed circuit that is overlapped by the electrical component comprises a planar portion on an inner surface of the housing.

13. The electronic device defined in claim 12 further comprising adhesive that mounts the electrical component within the housing.

14. The electronic device defined in claim 13 further comprising a plastic frame attached to the display, wherein the electrical component is attached to the frame with the adhesive.

15. The electronic device defined in claim 14 wherein the light-sensitive component comprises a camera and wherein the flexible printed circuit is configured to form a service loop.

16. Apparatus, comprising:
    an electronic device structure;
    a flexible printed circuit spring formed from a flexible printed circuit with a bend; and
    an electrical component that is soldered to the flexible printed circuit and that is biased towards the electronic device structure by the flexible printed circuit spring, wherein the electrical component comprises an antenna structure on the flexible circuit.

17. The apparatus defined in claim 16 wherein the flexible printed circuit spring includes a layer of material on the flexible printed circuit that is selected from the group consisting of: a metal layer and a plastic layer.

18. The apparatus defined in claim 16 wherein the flexible printed circuit spring has a shaped selected from the group consisting of: a tube shape, a corrugated shape, and an accordion shape.

* * * * *